United States Patent [19]

Taniguchi

[11] Patent Number: 4,906,056
[45] Date of Patent: Mar. 6, 1990

[54] HIGH SPEED BOOSTER CIRCUIT

[75] Inventor: Makoto Taniguchi, Hyogo, Japan

[73] Assignee: Mitsubishi Denki Kabushiki Kaisha, Tokyo, Japan

[21] Appl. No.: 181,140

[22] Filed: Apr. 13, 1988

[30] Foreign Application Priority Data

Apr. 14, 1987 [JP]  Japan ................................. 62-91193
Jun. 17, 1987 [JP]  Japan ................................. 62-151662

[51] Int. Cl.$^4$ .................. H03K 19/094; H03K 17/56; H03K 17/687; H03L 5/00
[52] U.S. Cl. ..................................... 307/482; 307/246; 307/451; 307/264; 307/578; 307/585
[58] Field of Search ............... 307/482, 246, 451, 264, 307/279, 475, 578, 473, 585

[56] References Cited

U.S. PATENT DOCUMENTS

| | | | |
|---|---|---|---|
| 3,889,135 | 6/1975 | Nomiya et al. | 307/482 |
| 4,061,929 | 12/1977 | Asano | 307/246 |
| 4,382,194 | 5/1983 | Nakano et al. | 307/578 |
| 4,649,300 | 3/1987 | Schutz | 307/482 |
| 4,731,552 | 3/1988 | Miyamoto | 307/264 |

OTHER PUBLICATIONS

IEEE J. Sol. St. Circuits: "Fully Boosted 64K Dynamic RAM With Automatic and Self-Refresh" by M. Taniguchi et al, vol. SC-16, No. 5, Oct. 1981, pp. 492–498.

IEEE J. Sol. St. Circuits: "A 100 ns 5 V Only 64K×1 MOS Dynamic RAM" by J. Chan et al, vol. SC=−15, No. 5, Oct. 1980, pp. 839–846.

Primary Examiner—Stanley D. Miller
Assistant Examiner—Trong Quang Phan
Attorney, Agent, or Firm—Lowe, Price, LeBlanc, Becker & Shur

[57] ABSTRACT

An output signal line is boosted at first by a first booster circuit using a second power supply. Thereafter, it is boosted by a second booster circuit using a third power supply.

10 Claims, 4 Drawing Sheets

HIGH SPEED BOOSTER CIRCUIT

BACKGROUND OF THE INVENTION

1. Field of the Invention

The present invention relates to a high speed boosting circuit and, more specifically, it relates to a high speed boosting circuit employed in a MOS type integrated circuit and the like.

2. Description of the Prior Art

FIG. 1 is a schematic diagram showing one example of a conventional high speed boosting circuit. Referring to the figure, the circuit comprises a first power supply $V_{SS}$ (which is selected to be the ground voltage, for example), a second power supply $V_{CC}$ (which is selected to be the voltage higher than the voltage of the first power supply $V_{SS}$), a third power supply $V_{GG}$ (which is selected to be the voltage higher than the second power supply $V_{CC}$), a bootstrap type inverter 100 (hereinafter referred to as a bootstrap circuit) and a driving circuit 200, wherein a signal $\phi$ having the voltage of approximately the same level as the third power supply $V_{GG}$ is outputted at high speed to the output signal line $L_{OUT}$ of the driving circuit 200 in response to the input of an input signal $\phi$ to the input signal line $L_{IN}$ of the bootstrap circuit 100. The capacitance C3 is a load capacitance of the output signal line $L_{OUT}$.

The operation of the above described circuit will be described in the following. FIG. 4 is a diagram of waveforms illustrating the operation of one embodiment of the present invention which will be described later. However, since the waveforms of the input signal $\phi$, the precharge signal P and the node A are the same in the circuit of FIG. 1 and, in addition, the waveform of the output signal $\phi$ in the circuit of FIG. 1 is denoted by a dotted line, the operation of the above described conventional circuit will be described with reference to FIG. 4.

Before the input signal $\phi$ is inputted to the input signal line $L_{IN}$, that is, when the gate voltage of the transistor 3 is at the "H" level, all of the transistors 1 to 3 are turned on and the node A is maintained at the voltage of approximately the same level as that of the first power supply $V_{SS}$. When an input signal $\phi$ of "L" level is applied to the input signal line $L_{IN}$ in this state, the transistor 3 turns off and the voltage at the node A rises rapidly. Consequently, the gate voltage of the transistor 2 is boosted higher than the voltage of the second power supply $V_{CC}$ by the boost function of the capacitor C1, strongly turning the transistor 2 on. Therefore, the impedance between the drain and source of the transistor 2 becomes extremely low, and the voltage at the node A is boosted to approximately the same level as the voltage of the second power supply $V_{CC}$.

When the node A reaches approximately the same level as the second power supply $V_{CC}$, a transistor 8 in the driving circuit 200 turns on to charge the node B. Correspondingly, a transistor 9 turns on and the voltage of the output signal $\phi$ gradually increases. When the output signal $\phi$ rises, a transistor 5 turns on, so that the node C discharges and a transistor 6 turns off. Consequently, the voltage at the node D begins to rise and the voltage at the node B is boosted higher than the voltage level of the second power supply $V_{CC}$ through the capacitor C2. Therefore, the transistor 9 strongly turns on and the voltage level of the third power supply $V_{GG}$ appears on the output signal $\phi$.

In the conventional circuit such as described above, the voltage of the second power supply $V_{CC}$ is boosted on the semiconductor chip to obtain a voltage $V_{GG}$ which is higher than the second power supply $V_{CC}$ and by employing this voltage $V_{GG}$, an output signal $\phi$ having the voltage level higher than that of the second power supply $V_{CC}$ is generated. Therefore, the third power supply $V_{GG}$ is provided on the semiconductor chip as an internal power supply. A power supply such as shown in FIG. 2 is conventionally used as the internal power supply. The internal power supply shown in FIG. 2 comprises three inverters 12a to 12c, two transistors 13 and 14, and two capacitors C4 and C5. However, since the impedance of the above described internal power supply is extremely high in general, it has small ability of current supply. Therefore, the "H" level voltage of the output signal $\phi$ may possibly become low dependent on the magnitude of the load capacitance C3 of the output signal line $L_{OUT}$ and on the frequency of the input signal $\phi$.

The following articles disclose other prior arts.

(1) IEEE Journal of Solid-State Circuits Vol. SC-15 No. 5 October 1980 "A 100 ns 5 V Only 64K ×1 MOS Dynamic RAM" pp. 839~846 (especially in FIG. 11(a), High Voltage Generator Circuit)

(2) IEEE Journal of Solid-State Circuits Vol. SC-16 No. 5 October 1981 "FULLY BOOSTED 64K DYNAMIC RAM WITH AUTOMATIC AND SELF-REFRESH" pp. 492–498 (especially in FIG. 2, Boosted Word Line Clock Generator)

The circuit shown in the above article (1) and the circuit shown in the above article (2) have the same defect as the conventional circuit of FIG. 1 or the defect of slow boosting speed.

SUMMARY OF THE INVENTION

The present invention was made to solve the above described problems and its object is to provide a high speed boosting circuit which is capable of generating a boost signal having sufficiently high level constantly at high speed.

Briefly stated, in the present invention, the voltage of the output signal line is boosted by a first booster circuit using a second power supply and the same is further boosted by a second booster circuit using a third power supply.

According to the present invention, the load of the third power supply can be reduced in boosting the voltage of the output signal line. Therefore, even if an internal power supply having small current power supply ability is used as the third power supply, the voltage of the output signal line can be boosted to a sufficiently high value constantly at high speed.

These objects and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
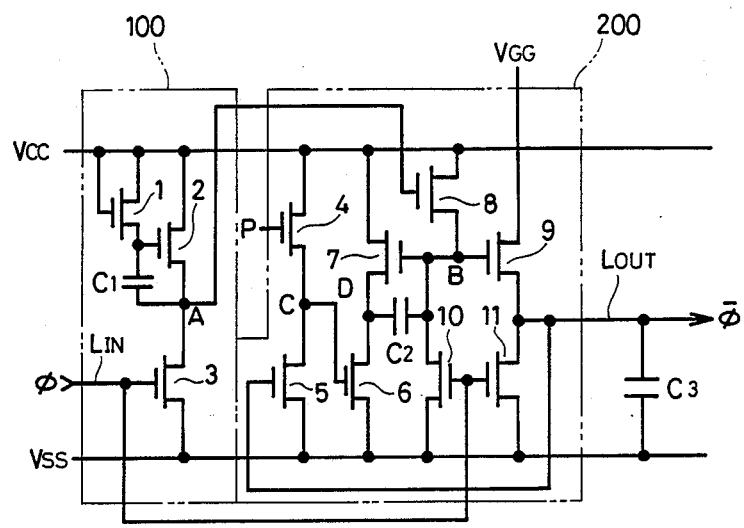
FIG. 1 is a schematic diagram showing one example of a conventional high speed booster circuit.
Figure 2:
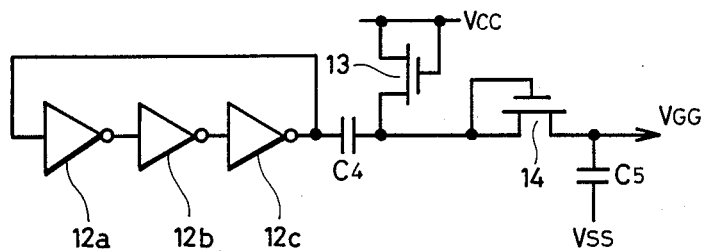
FIG. 2 is a schematic diagram showing one example of a structure of a third power supply $V_{GG}$ provided as an internal power supply.
Figure 3:
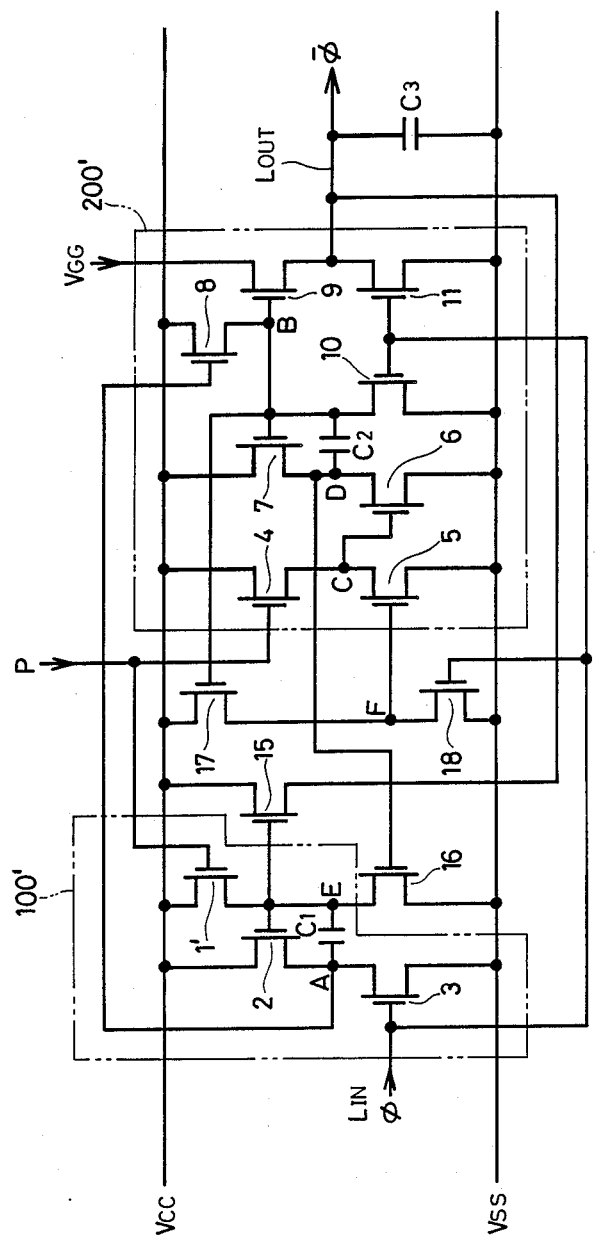
FIG. 3 is a schematic diagram showing one embodiment of the present invention.

FIG. 3 is a schematic diagram showing one example of the present invention. In the figure, the same or corresponding portions as in the conventional circuit of FIG. 1 are denoted by the same reference numerals. In this embodiment, transistors 15 to 18 are added to the structure of the conventional circuit of FIG. 1. The details of the circuit structure of this embodiment will be described in the following.

The bootstrap circuit 100' comprises transistors 1 to 3 and a capacitor C1. Transistors 2 and 3 are connected in series to be interposed between the second power supply $V_{CC}$ and the first power supply $V_{SS}$. The node (node A) between the transistor 2 and the transistor 3 is connected to one electrode of the capacitor C1. The gate of the transistor 2 is connected to the second power supply $V_{CC}$ through the transistor 1' as well as to the other electrode of the capacitor C1 through a node E. A precharge signal P is applied to the gate of the transistor 1'. An input signal $\phi$ is applied to the gate of the transistor 3 through the input signal line $L_{IN}$.

A transistor 15 (a first transistor) is interposed between the second power supply $V_{CC}$ and the output signal line $L_{OUT}$ and its gate is connected to the other electrode of the capacitor C1 through said node E. The transistor 15 is controlled by the output voltage of the bootstrap circuit 100' to transmit the voltage of the second power supply $V_{CC}$ to the output signal line $L_{OUT}$. The transistor 15 cooperates with the bootstrap circuit 100' to constitute a first booster circuit. A transistor 16 is to discharge the node E and is interposed between the node E and the first power supply $V_{SS}$. Transistors 17 and 18 cooperate with the driving circuit 200' to constitute a second booster circuit. These transistors 17 and 18 are connected in series to be interposed between the second power supply $V_{CC}$ and the first power supply $V_{SS}$.

The driving circuit 200' comprises transistors 4 to 11 and a capacitor C2. The transistors 4 and 5 are connected in series to be interposed between the second power supply $V_{CC}$ and the first power supply $V_{SS}$. The said precharge signal P is applied to the gate of the transistor 4. The gate of the transistor 5 is connected to a node F which is the node between the said transistors 17 and 18. The node C between the transistors 4 and 5 is connected to the gate of the transistor 6. Transistors 7 and 6 are connected in series to be interposed between the second power supply $V_{CC}$ and the first power supply $V_{SS}$. A node D is the node between the transistors 7 and 6 which connected to one electrode of the capacitor C2. The gate of the transistor 7 is connected to the node B. The node B is connected to the gates of the transistors 17 and 9 (the second transistor) as well as to the other electrode of the capacitor C2. A transistor 8 is interposed between the node B and the second power supply $V_{CC}$. The gate of the transistor 8 is connected to the said node A. A transistor 10 is interposed between the other electrode of the capacitor C2 and the first power supply $V_{SS}$. Transistors 9 and 11 are connected in series to be interposed between the third power supply $V_{GG}$ and the first power supply $V_{SS}$. The input signal $\phi$ is applied to the gates of the transistors 10 and 11 through the input signal line $L_{IN}$. The node between the transistors 9 and 11 is connected to the output signal line $L_{OUT}$.

Although MOS field effect transistors are used for all of the transistors 1 to 11 and 15 to 18 in the above described embodiment, bipolar transistors may be used for these transistors.

Figure 4:
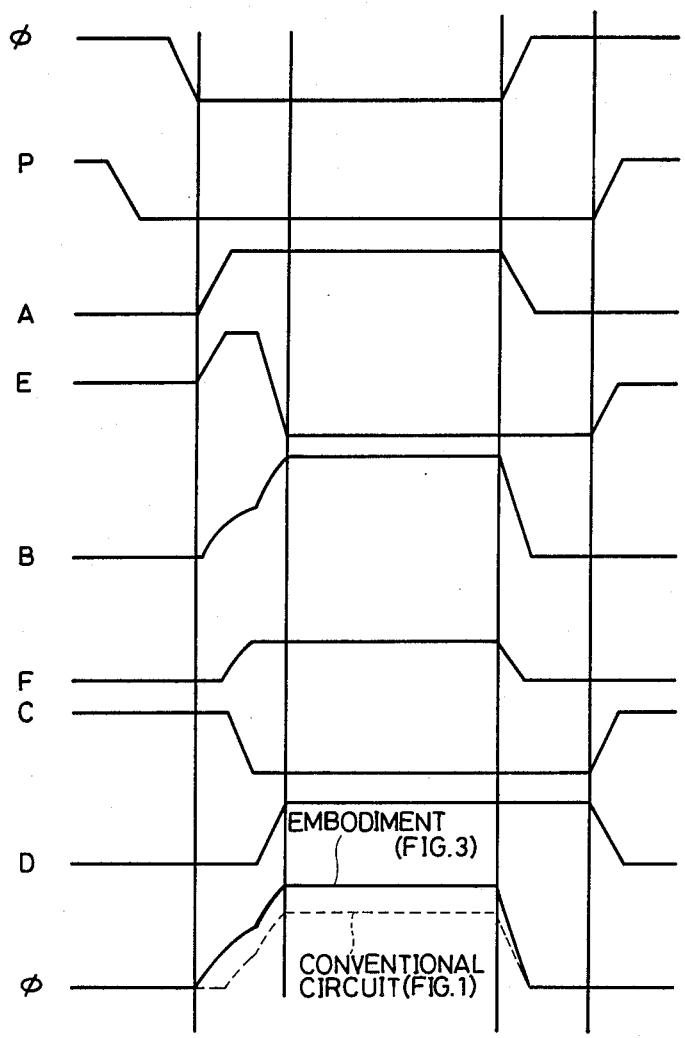
FIG. 4 is a diagram of waveforms for describing the operation of the embodiment of FIG. 3.

FIG. 4 shows the waveform of each of the signals and the change in the voltage at each node in the embodiment of FIG. 3. The operation of the above described embodiment will be hereinafter described with reference to FIG. 4.

First, transistors 1 and 4 are turned on by the precharge signal P and the nodes C and E are precharged to the "H" level (that is, the voltage level of the second power supply $V_{CC}$). When an input signal $\phi$ of "L" level is applied to the input signal line $L_{IN}$ in this state, the transistor 3 turns off and the voltage at the node A begins to increase. Therefore, by the boost function of the capacitor C1, the voltage at the node E is boosted higher than the level of the second power supply $V_{CC}$. Consequently, the transistor 2 is strongly turned on to boost the voltage at the node A to approximately the same level as the second power supply $V_{CC}$ and the transistor 15 is also strongly turned on. Therefore, the voltage of the second power supply $V_{CC}$ is almost directly transmitted to the output signal line $L_{OUT}$ through the transistor 15, rapidly increasing the voltage at the output signal line to the level of the second power supply $V_{CC}$.

Meanwhile, the voltage at the node A is transmitted to the gate of the transistor 8 to turn the transistor 8 on. Consequently, the voltage at the node B increases slowly to turn on the transistors 7, 9 and 17. When the transistor 17 is turned on, the voltage at the node F increases, so that the transistor 5 turns on to discharge the node C to "L" level (that is, the voltage level of the first power supply $V_{SS}$). Consequently, the transistor 6 turns off and the voltage at the node D increases. When the voltage at the node D increases, the transistor 16 turns on to discharge the node E. Therefore, the voltage at the node E decreases and the transistor 15 is turned off. Consequently, the charging path from the second power supply $V_{CC}$ to the output signal line $L_{OUT}$ is cut. This prevents charges from flowing backward from the output signal line $L_{OUT}$ to the second power supply $V_{CC}$ due to the charge to the output signal line $L_{OUT}$ using the third power supply $V_{GG}$ which will be effected subsequently.

Meanwhile, as described above, when the voltage at the node D increases, the voltage at the node B is boosted to the level higher than that of the second power supply $V_{CC}$ by the boost function of the capacitor C2. Therefore, the transistor 9 is strongly turned on to transmit the voltage of the third power supply $V_{GG}$ directly to the output signal line $L_{OUT}$. Consequently, the voltage level of the output signal $\phi$ rapidly rises to the voltage level of the third power supply $V_{GG}$.

When the input signal $\phi$ rises again to the "H" level after the output signal $\phi$ is boosted, the transistors 10, 11 and 18 turn on, so that the voltages at the nodes B and F and the voltage of the output signal $\phi$ fall to the "L" level.

Now, although the boosting operation in the capacitor C1 is carried out directly after the fall of the input signal $\phi$ to the "L" level, the boosting operation in the capacitor C2 is carried out after the transistors 8, 17, 5 and 6 turned on or off, so that it is delayed from the boosting operation in the capacitor C1 to some extent. Therefore, the transistor 9 strongly turns on after the second power supply $V_{CC}$ charged the output signal line $L_{OUT}$ through the transistor 15. Therefore, the output signal line $L_{OUT}$ is at first charged to the voltage level of the second power supply $V_{CC}$ and thereafter, it is charged by the third power supply $V_{GG}$. Consequently, the load of the third power supply $V_{GG}$ can be reduced and a boost signal of sufficient level can be generated at high speed with low power.

FIG. is a schematic diagram showing another embodiment of the present invention. This embodiment has a structure which is more simple than the embodiment of FIG. 3. Namely, a MOS transistor 19 (a first transistor) is interposed between the second power supply $V_{CC}$ and the output signal line $L_{OUT}$. The gate of the transistor 19 is connected to the node A in the bootstrap circuit 100. Other structures are the same as the conventional circuit shown in FIG. 1. In this embodiment, a first booster circuit is structured by the bootstrap circuit and the transistor 19 while a second booster circuit is structured by the driving circuit 200.

Figure 5:
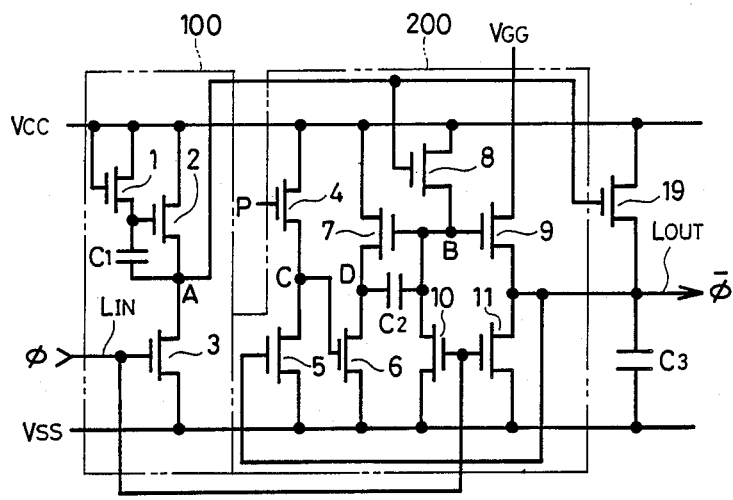
FIG. 5 is a schematic diagram showing another embodiment of the present invention.
Figure 6:
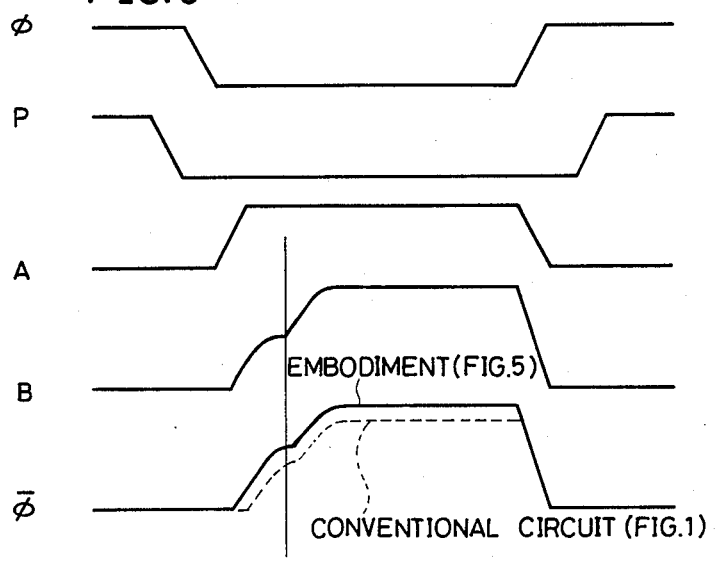
FIG. 6 is a diagram of waveforms for describing the operation of the embodiment of FIG. 5.

FIG. 6 shows the waveform of each signal and the change in the voltage at each node in the embodiment of FIG. 5. The operation of the embodiment of FIG. 5 will be described in the following with reference to FIG. 6.

When the voltage at the node A is boosted to the level of the second power supply $V_{CC}$, the voltage at the node B becomes the value below the voltage of the node A ($V_A$) by $V_{TH}$ ($V_{TH}$ is the threshold voltage of the transistor). Meanwhile, $V_A$ is applied to the gate of the transistor 19, and when it turns on earlier than the transistor 9, so that the charge to the output signal $\phi$ is carried out first through the transistor 19. Therefore, the voltage from the second power supply $V_{CC}$ is supplied through the transistor 19 until the level of the output signal $\phi$ reaches $V_{CC} - V_{TH}$. The voltage from the third power supply $V_{GG}$ is applied to the output signal $\phi$ through the transistor 9 when the level exceeds $V_{CC} - V_{TH}$, after the node B is boosted.

As described above, in the circuit of the embodiment shown in FIG. 5, the charge to the output signal $\phi$ by the third power supply $V_{GG}$ is carried out after the level of the said output signal $\phi$ exceeds $V_{CC} - V_{TH}$, so that the load on the third power supply $V_{GG}$ for boosting the output signal $\phi$ can be reduced and a boost signal of sufficient "H" level can be obtained with low power and at high speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A high speed booster circuit having a first power supply set at a first voltage level, a second power supply set at a second voltage level which is higher than said first voltage level, a third power supply set at a third voltage level which is higher than said second voltage level, an input signal line and an output signal line wherein the voltage level of said output signal line is raised at high speed to approximately the same level as said third voltage level, comprising:

a first booster circuit including a boost capacitor controlled by said input signal for providing a low impedance connection of said output signal line to said second power supply; and a driver circuit including a second booster circuit responsive to a signal appearing at a terminal of said boost capacitor for providing a low impedance connection of said output signal line to said third power supply and interrupting said low impedance connection of said first booster circuit.

2. A high speed booster circuit according to claim 1, wherein said third power supply is an internal power supply.

3. A high speed booster circuit according to claim 2, wherein the output voltage of said third power supply is provided by boosting the voltage of said second power supply.

4. A high speed booster circuit having a first power supply set at a first voltage level, a second power supply set at a second voltage level which is higher than said first voltage level, a third power supply set at a third voltage level which is higher than said second voltage level, an input signal line and an output signal line wherein the voltage level of said output signal lines is raised at high speed to approximately the same level as said third voltage level, comprising:

a first booster circuit including a boost capacitor controlled by said input signal for providing a low impedance connection of said output signal line to said second power supply; and a driver circuit including a second booster circuit responsive to a signal appearing at a terminal of said boost capacitor for providing a low impedance connection of said output signal line to said third power supply and interrupting said low impedance connection of said first booster circuit, wherein said first booster circuit comprises:

a first voltage generation circuit coupled to said first power supply and said second power supply for generating a voltage and providing at least said second voltage level in response to an occurrence of said input signal; and a first transistor interposed between said second power supply and said output signal line which is controlled by the output voltage of said first voltage generation circuit; and said second booster circuit comprises:

a second voltage generation circuit coupled to said first power supply and said second power supply for generating a voltage having a level higher than said second voltage level with a slight delay from the generation of the voltage in said first voltage generation circuit; and a second transistor interposed between said third power supply and said output signal line which is controlled by the output voltage of the second voltage generation circuit.

5. A high speed booster circuit according to claim 4, wherein said first voltage generation circuit generates two kinds of voltages in which a first voltage is approximately the same as said second voltage level and a second voltage is higher than said second voltage level;

said first transistor is controlled by said second voltage; and said second voltage generation circuit operates in response to said first voltage.

6. A high speed booster circuit according to claim 4, wherein said second voltage generation circuit operates in response to the increase of the voltage of said output signal.

7. A high-speed booster circuit according to claim 4 further including transistor switches for selectively coupling each terminal of said capacitor to each of said first and second power supplies, the improvement comprising:
   a further transistor including within said first booster circuit for controlling at least one of said transistor switches, said transistor having conduction terminals connected between a second power supply and a control electrode of said at least one of said transistor switches for supplying a charge from said second power supply to one electrode of said capacitor in response to said precharge signal applied to a control electrode of said transistor.

8. In a high-speed voltage booster circuit of a type having a bootstrap circuit and a driver circuit for use with a semiconductor integrated circuit, at least said driver circuit having a capacitor, the improvement comprising
   a circuit interposed between said bootstrap circuit and said driver circuit comprising a first transistor and a second transistor connected with series between first and second power supplies, a node between said first and second transistors being connected to an input of said driver circuit, said first transistor having a control electrode connected to a first electrode of said capacitor of said driver circuit and said second transistor having a control electrode connected to an input of said bootstrap circuit.

9. In a high-speed booster circuit according to claim 8 further including transistor switches for selectively coupling each terminal of said capacitor to each of said first and second power supplies, the improvement further comprising:
   a further transistor including within said bootstrap circuit for controlling at least one of said transistor switches, said transistor having conduction terminals connected between a second power supply and a control electrode of said at least one of said transistor switches for supplying a charge from said second power supply to one electrode of said capacitor in response to said precharge signal applied to a control electrode of said transistor.

10. A high speed booster circuit having a first power supply set at a first voltage level, a second power supply set at a second voltage level which is higher than said first voltage level, a third power supply set at a third voltage level which is higher than said second voltage level, an input signal line and an output signal line wherein the voltage level of said output signal lines is raised at high speed to approximately the same level as said third voltage level, comprising:
   a first booster circuit including a boost capacitor controlled by said input signal for providing a low impedance connection of said output signal line to said second power supply; and
   a driver circuit including a second booster circuit responsive to a signal appearing at a terminal of said boost capacitor for providing a low impedance connection of said output signal line to said third power supply and interrupting said low impedance connection of said first booster circuit,
   wherein said first booster circuit comprises:
   a first voltage generation circuit coupled to said first power supply and said second power supply for generating a voltage and providing at least said second voltage level in response to an occurrence of said input signal; and
   a first transistor interposed between said second power supply and said output signal line which is controlled by the output voltage of said first voltage generation circuit; and
   said second booster circuit comprises:
   a second voltage generation circuit coupled to said first power supply and said second power supply for generating a voltage having a level higher than said second voltage level with a slight delay from the generation of the voltage in said first voltage generation circuit; and
   a second transistor interposed between said third power supply and said output signal line which is controlled by the output voltage of the second voltage generation circuit,
   further comprising
   a third transistor for discharge interposed between the gate of said first transistor and said first power supply and responsive to the output of said second voltage generation circuit generating a level higher than said second voltage level.

* * * * *